United States Patent [19]

Yagita et al.

[11] Patent Number: 5,210,504
[45] Date of Patent: May 11, 1993

[54] SEMICONDUCTOR DEVICE FOR TV TUNER AND TV TUNER USING THE SAME

[75] Inventors: Hideki Yagita, Hirakata; Tadayoshi Nakatsuka, Osaka; Taketo Kunihisa, Neyagawa; Michiaki Tsuneoka, Takatsuki; Yukio Sakai, Sakai; Kazuhiro Yahata, Osaka, all of Japan

[73] Assignee: Matsushita Electric Industrial Co., Ltd., Osaka, Japan

[21] Appl. No.: 851,900

[22] Filed: Mar. 16, 1992

[30] Foreign Application Priority Data

May 23, 1991 [JP] Japan .................................. 3-118710

[51] Int. Cl.5 .......................... H03G 3/30; H04N 5/14
[52] U.S. Cl. ...................................... 330/253; 330/254; 358/184
[58] Field of Search ............... 330/253, 254, 277, 278, 330/311; 358/174, 177, 184, 191.1

[56] References Cited

U.S. PATENT DOCUMENTS

| 4,209,805 | 6/1980 | Ikeda et al. ................... 358/184 X |
| 4,438,529 | 3/1984 | Sato ................................. 455/190 |
| 4,459,555 | 6/1984 | Jett, Jr. ............................. 330/253 |

FOREIGN PATENT DOCUMENTS 60-66510 8/1985 Japan .

OTHER PUBLICATIONS

IBM Technical Disclosure Bulletin, "Bifet Variable Gain Amplifier", vol. 29, No. 11, Apr. 1, 1987, p. 4840.

Primary Examiner—Steven Mottola
Attorney, Agent, or Firm—Mason, Fenwick & Lawrence

[57] ABSTRACT

A semiconductor device for a tuner capable of simultaneously satisfying a low noise factor, low third order distortion characteristics and low power consumption, and a tuner using this semiconductor device for a tuner and capable of reducing the size and eliminating labor during assembly. The semiconductor device is a variable gain amplification circuit comprising a gate grounded circuit using a transistor, and a differential amplification circuit including transistors and constant current sources. Transistors are used as variable resistance devices, and the gain of the gate grounded circuit can be varied by changing the gate voltage of a transistor. The gain of the differential amplification circuit can be varied by changing the gate voltage of another transistor. The overall gain of the circuit can be varied within a necessary range by simultaneously operating these gain controls, and the third order distortion can be improved monotonously with the decrease of the gain.

12 Claims, 12 Drawing Sheets

SEMICONDUCTOR DEVICE FOR TV TUNER AND TV TUNER USING THE SAME

BACKGROUND OF THE INVENTION

This invention relates to a semiconductor device for a tuner for use in tuners of television receivers (hereinafter referred to as TV tuners") for satellite broadcasting, having low noise, low third order distortion and moreover, low power consumption.

FIG. 11 of the accompanying drawings shows a block diagram of a prior art TV tuner circuit which is an indoor TV tuner (so-called "BS tuner") for receiving satellite broadcasting, by way of example. In the drawing, reference numeral 1001 denotes an input terminal from an outdoor unit, 1002 is a band-pass filter, 1003 is a broad-band RF amplifier, 1004 is a variable attenuator, 1005 is a mixer circuit, 1006 a variable gain IF amplifier, 1007 is a band-pass filter, 1008 is an FM demodulator, 1009 is a video signal output terminal, 1010 is a buffer circuit for local oscillation signals, and 1012 is a phase-locked loop (PLL) circuit for stabilizing an oscillation frequency.

The intensity of the input signal varies greatly in the TV tuner circuit depending on the condition of use. In the case of ordinary home use, the signal intensity is from −60 dBm to −40 dBm but in the case of a community receiving system, an input of about 0 dBm is sometimes inputted. In the case of the excessive input, third order distortion of mutually different channel signals enters the band and leads to cross modulation. Therefore, it is necessary to damp the excessive input signal and to prevent distortion of the video signals by the use of a variable attenuator and a variable gain amplifier. Also, the TV tuner must by all means secure a sufficient third order distortion suppression ratio for any input signal intensity.

In the prior art example shown in FIG. 11, a variable attenuator comprising the RF amplifier 1003 and a PIN diode and the variable gain IF amplifier 1006 are employed as the variable attenuator of the input circuit portion in order to prevent excessive input. If the input signal is weak in this case, the damping factor of the variable attenuator 1004 is set to 0 dB and the broad band RF amplifier 1003 amplifies the signal. In this instance, the broad band RF amplifier 1003 must have a high noise factor. If the excessive input signal is inputted, on the other hand, the damping factor of the variable attenuator 1004 is set to −40 dB so as to prevent the excessive signal from being inputted to the mixer circuit 1005 but in this case, too, the excessive input signal is inputted to the RF amplifier 1003. For this reason, the RF amplifier 1003 must simultaneously possess excellent third order distortion characteristics and excellent cross modulation characteristics. In practice, however, the RF amplifier 1003 is used at an operation point at which current consumption is great, or a greater importance is set to only one of these characteristics, in order to simultaneously satisfy the low noise characteristics and the low third order distortion characteristics. These problems impede higher performance and lower power consumption of the tuner.

The prior art includes also a circuit which uses a variable gain RF amplifier using a dual gate FET shown in FIG. 12A to replace the variable attenuator 1004 comprising the PIN diode of FIG. 11. FIG. 12A shows a circuit example of the variable gain RF amplifier, and FIG. 12B shows a third order distortion suppression ratio (dBc, −20 dBm input) for the gain of this circuit and its consumed current (mA).

When this variable gain RF amplifier using the dual gate FET is employed, a wide gain variable width of 30 dB to 40 dB can be secured even in a single stage amplification circuit.

However, there are, on the other hand, various other problems. For example, the distortion characteristics cannot be improved even if the gain is lowered at the time of application of the excessive input signal because the input impedance changes with the change of the damping factor, because the third order distortion changes in a complicated way with the decrease of the gain as shown in FIG. 12B and moreover because the third order distortion suppression ratio deteriorates with the decrease of the gain within the range of gain of 0 to 20 dB. Since Ids of the FET greatly changes with the change of the gain, it is difficult to keep the D.C. bias of the output by resistance load. Degradation of the third order distortion characteristics when the gain of the dual gate FET is lowered occurs because Ids is contracted by the second gate and the operation point enters the non-saturation region of the FET.

Furthermore, the conventional tuner circuit is produced by integrating discrete devices on a printed substrate. Therefore, the number of man-hours for assembly cannot be reduced when the tuner circuits are mass-produced, and since there are a large number of points which need adjustment, there are inevitable limits to the improvement in efficiency of the assembly process of the TV tuners and their scale-down.

According to the variable gain amplifier and the mixer circuit system of the prior art, it has been difficult to simultaneously satisfy the low noise factor, low third order distortion characteristics and low power consumption required for the TV tuners, and the reduction of the number of man-hours for the assembly and scale-down of the tuners have been difficult, as well.

SUMMARY OF THE INVENTION

It is an object of the present invention to provide a semiconductor device for a tuner which can simultaneously provide a low noise factor, low third order distortion characteristics and low power consumption, and a tuner capable of reducing the size and the number of man-hours for assembly by the use of the inventive semiconductor device.

A first embodiment of the semiconductor device includes a gate grounded circuit and a differential amplification circuit.

The gate grounded circuit uses the source electrode of a first FET as its input terminal, connects the drain electrode of the first FET to a first constant voltage source through a first load, and grounds the gate electrode of the first FET.

The differential amplification circuit connects the drain electrode of a second FET to a second constant voltage source through a second load, connects the source electrode of the second FET to a first constant current source, connects the drain electrode of a third FET to the second constant voltage source through a third load, connects further the source electrode of the third FET to a second constant current source, and also connects a fourth FET between the source electrode of the second FET and the source electrode of the third FET.

The drain electrode of the first FET of the gate grounded circuit and the gate electrode of the second FET of the differential amplification circuit are connected, and a fifth FET is interposed between the gate electrode of the second FET and the gate electrode of the third FET.

A second embodiment of the semiconductor device includes a gate grounded circuit and a differential amplification circuit.

The gate grounded circuit uses the source electrode of a first FET as the input terminal, connects the drain electrode of the first FET to a first constant voltage source through a first load, connects a second FET in parallel with the first load, and grounds the gate electrode of the first FET.

The differential amplification circuit connects the drain electrode of a third FET to a second constant voltage source through a second load, connects the source electrode of the third FET to a constant current source, connects the drain electrode of a fourth FET to the second constant voltage source through a third load, further connects the source electrode of the fourth FET to the constant current source and connects a fifth FET between the drain electrode of the third FET and the drain electrode of the fourth FET.

The drain electrode of the first FET of the gate grounded circuit and the gate electrode of the third FET of the differential amplification circuit are connected, and a fourth load is interposed between the gate electrode of the third FET and the gate electrode of the fourth FET.

A third embodiment of the semiconductor device includes a gate grounded circuit and a differential amplification circuit.

The gate grounded circuit uses the source electrode of a first FET as its input terminal, connects the drain electrode of the first FET to a first voltage source through a first load, connects a second FET in parallel with the first load, and grounds the gate electrode of the first FET.

The differential amplification circuit connects the drain electrode of a third FET to a second constant voltage source through a second load, connects the source electrode of the third FET to a first constant current source, connects the drain electrode of a fourth FET to the second constant voltage source through a third load, further connects the source electrode of the fourth FET to a second constant current source, and connects a fifth FET between the source electrode of the third FET and the source electrode of the fourth FET.

The drain electrode of the first FET of the gate grounded circuit and the gate electrode of the third FET of the differential amplification circuit are connected, and a fourth load is interposed between the gate electrode of the third FET and the gate electrode of the fourth FET.

A fourth embodiment of the semiconductor device includes a gate grounded circuit, a differential amplification circuit and a double-balanced mixer circuit.

The gate grounded circuit uses the source electrode of a first FET as its input terminal, connects the drain electrode of the first FET to a constant voltage source through a first load, connects a second FET in parallel with the first load, and grounds the gate electrode of the first FET.

The differential amplification circuit connects the source electrode of a third FET to a first constant current source, connects the source electrode of a fourth FET to a second constant current source, and connects a fifth FET between the source electrode of the third FET and the source electrode of the fourth FET.

The double-balanced mixer circuit connects the drain electrode of a sixth FET and the drain electrode of a seventh FET to a constant voltage source, connects the drain electrode of an eight FET and the drain electrode of a ninth FET to the constant voltage source through a second load, connects the source electrode of the sixth FET to the source electrode of the eighth FET, connects the source electrode of the seventh FET to the source electrode of the ninth FET, uses the gate electrode of the sixth FET and the gate electrode of the ninth FET as a first input terminal of a local oscillation signal, and uses the gate electrode of the seventh FET and the gate electrode of the eighth FET as a second input terminal of the local oscillation signal.

The drain electrode of the first FET of the gate grounded circuit is connected to the gate electrode of the third FET of the differential amplification circuit, the third load is interposed between the gate electrode of the third FE and the gate electrode of the fourth FET, the source electrodes of the sixth and eighth FETs are connected to the drain electrode of the third FET and the source electrodes of the seventh and ninth FETs are connected to the drain electrode of the fourth FET.

A fifth embodiment of the semiconductor device includes a gate grounded circuit, a differential amplification circuit and a double-balanced mixer circuit.

The gate grounded circuit uses the source electrode of a first FET as its input terminal, connects the drain electrode of the first FET to a constant voltage source through a first load, connects a second FET in parallel with the first load and grounds the gate electrode of the first FET.

The differential amplification circuit connects the source electrode of a third FET to a constant current source, connects the source electrode of a fourth FET to the constant current source, and connects a fifth FET between the drain electrode of the third FET and the drain electrode of the fourth FET.

The double-balanced mixer circuit connects the drain electrodes of sixth and seventh FETs to the constant voltage source, connects the drain electrodes of eighth and ninth FETs to the constant voltage source through a second load, connects the source electrode of the sixth FET to the source electrode of the eighth FET, connects the source electrode of the seventh FET to the source electrode of the ninth FET, uses the gate electrodes of the sixth and ninth FETs as a first input terminal for a local oscillation signal, and uses the gate electrodes of the seventh and eighth FETs as a second input terminal of the local oscillation signal.

The drain electrode of the first FET of the gate grounded circuit is connected to the gate electrode of the third FET of the differential amplification circuit, the third load is interposed between the gate electrode of the third FET and the gate electrode of the fourth FET, connects the source electrodes of the sixth and eighth FETs to the drain electrode of the third FET, and connects the source electrodes of the seventh and ninth FETs to the drain electrode of the fourth FET.

A sixth embodiment of the semiconductor device includes a gate grounded circuit, a differential amplification circuit and a double-balanced mixer circuit.

The gate grounded circuit uses the source electrode of a first FET as its input terminal, connects the drain electrode of the first FET to a constant voltage source through a first load, and grounds the gate electrode of the first FET.

The differential amplification circuit connects the source electrode of a second FET to a first constant current source, connects the source electrode of the third FET to a second constant current source, and connects a fourth FET between the source electrode of the second FET and the source electrode of the third FET.

The double-balanced mixer circuit connects the drain electrodes of fifth and sixth FETs to a constant voltage source, connects the drain electrodes of seventh and eighth FETs to the constant voltage source through a second load, connects the source electrode of the fifth FET to the source electrode of the seventh FET, connects the source electrode of the sixth FET to the source electrode of the eighth FET, uses the gate electrodes of the fifth and eighth FETs as a first input terminal of a local oscillation signal, and uses the gate electrodes of the sixth and seventh FETs as a second input terminal of the local oscillation signal.

The drain electrode of the first FET of the gate grounded circuit is connected to the gate electrode of the second FET of the differential amplification circuit, a ninth FET is interposed between the gate electrode of the second FET and the gate electrode of the third FET, connects the source electrodes of the fifth and seventh FETs to the drain electrode of the second FET, and connects the source electrodes of the sixth and eighth FETs to the drain electrode of the third FET.

A tuner as defined in the appended claims has a structure in which each of the several embodiments of the semiconductor device is mounted.

According to the structure of the first embodiment, the fourth and fifth FETs are used as variable resistance devices, the gain of the gate grounded circuit can be changed by changing the gate voltage of the fifth FET, and the gain of the differential amplification circuit can be changed by changing the gate voltage of the fourth FET. Accordingly, the gain of the circuit can as a whole be changed within a necessary range by simultaneously operating the gain control by the fourth and fifth FETs. Moreover, since the currents flowing through the gate grounded circuit and the differential amplification circuit do not change D.C.-wise within the gain variable range, third order distortion characteristics can be improved monotonously with the decrease of the gain.

According to the structures of the second and third embodiments, the second FET of the variable resistance device is used for the gain control of the gate grounded circuit and the fifth FET of the variable resistance device is used for the gain control of the differential amplification circuit. The gain of the circuit can be changed as a whole within a necessary range by simultaneously operating the gain control by the second and fifth FETs. Moreover, since the currents flowing through the gate grounded circuit and the differential amplification circuit do not change D.C.-wise within the gain variable range, third order distortion characteristics can be improved monotonously with the decrease of the gain.

According to the structure of the fourth and fifth embodiments, the second FET of the variable resistance device is used for the gain control of the gate grounded circuit and the fifth FET of the variable resistance device is used for the gain control of the differential amplification circuit. According to the structure of claim 6, the ninth FET of the variable resistance device is used for the gain control of the gate grounded circuit and the fourth FET of the variable resistance device is used for the gain control of the differential amplification circuit. When the gain control by the FETs used as the variable resistance devices are simultaneously operated, the conversion gate of the circuit can be changed as a whole within a necessary range. Moreover, since the currents flowing through the gate grounded circuit and the differential amplification circuit do not change D.C.-wise within the gain variable range, third order distortion characteristics can be improved monotonously with the decrease of the conversion gain.

Third order distortion characteristics can be improved monotonously with the decrease of the gain or the conversion gain by mounting the semiconductor device in a tuner.

DESCRIPTION OF THE PREFERRED EMBODIMENTS

Figure 1:
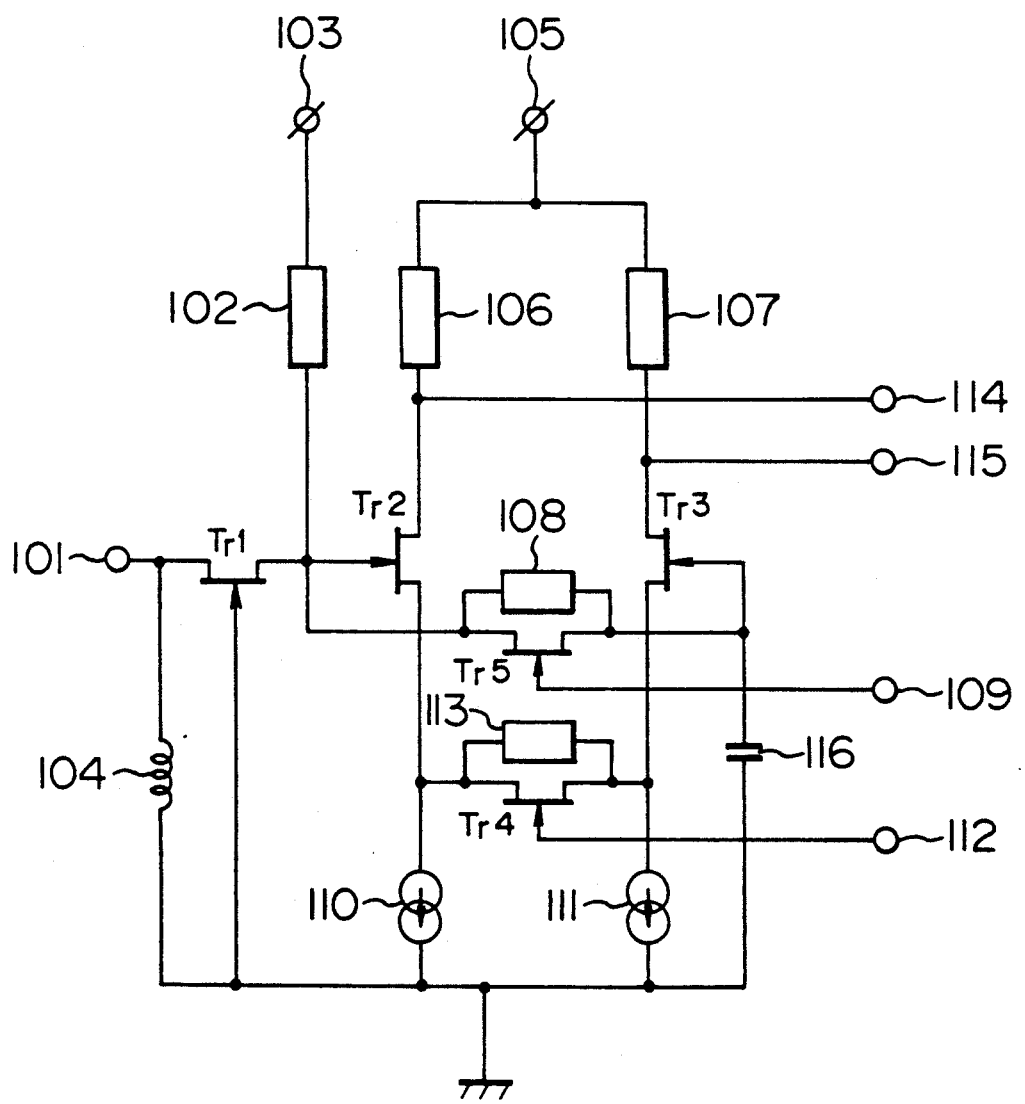
FIG. 1 is a circuit diagram of a semiconductor device for a tuner according to a first embodiment of the present invention.

The first embodiment of the present invention will be explained with reference to FIG. 1.

The semiconductor device for a tuner is a variable gain amplification circuit comprising a gate grounded circuit which uses a transistor Tr1 and a differential amplification circuit which includes transistors Tr2, Tr3 and constant current sources 110, 111.

The gate grounded circuit uses the source electrode of the transistor Tr1 (first FET) as its input terminal 101, connects the drain electrode to a constant voltage source 103 (first constant voltage source) through a load 102 (first load), and grounds the gate electrode. A choke coil 104 is connected as a source load of the transistor Tr1.

The differential amplification circuit connects the drain electrode of the transistor Tr2 (second FET) to the constant voltage source 105 (second constant voltage source) through a load 106 (second load,) connects the source electrode to the constant current source 110 (first constant current source), further connects the drain electrode of the transistor Tr3 (third FET) to the constant voltage source 105 through a load 107 (third load), connects the source electrode to the constant current source 111 (second constant current source), and interposes a parallel circuit of a transistor Tr4 (fourth FET) and a fixed resistance 113 between the source electrode of the transistor Tr2 and the source electrode of the transistor Tr3.

The drain electrode of the transistor Tr1 of the gate grounded circuit and the gate electrode of the transistor Tr2 of the differential amplification circuit are connected to each other, and a parallel circuit of a transistor Tr5 (fifth FET) and a fixed resistance 108 is interposed between the gate electrode of the transistor Tr2 and the gate electrode of the transistor Tr3. Reference numerals 109 and 112 denote gate electrode terminals, 114 and 115 denote output terminals, and 116 does a capacitor for grounding high frequency-wise the gate potential of the transistor Tr3.

The conductance gm of the transistor Tr1 is 20 mS and its threshold voltage Vth is −0.4 V. The conductance gm is selected so that the input impedance is 50 Ω. Since the source load of the transistor Tr1 is the choke coil 104 of 500 mH, a 0 V bias is applied to its gate and a current of Idss=8 mA always flows through the transistor Tr1. The drain load 102 of the transistor Tr1 is a 1 mH choke coil and is connected to the constant voltage source 103 of 3.0 V. Each of the transistor Tr2 and Tr3 has a conductance gm of 120 mS and a threshold voltage Vth of −0.4 V. The two constant current sources 110 and 111 are 24 mA constant current sources, and each of the drain loads 106 and 107 comprises a parallel circuit of a 1 mH choke coil and a 50 Ω resistance. The constant voltage source 105 of the differential amplification circuit is 6.0 V, and a capacitor 116 is 1000 pF.

The conductance gm of the transistor Tr4 used as the variable resistance device is 50 mS and the transistor can be varied within the range of 20 to 500 Ω by the gate bias. At this time, the fixed resistance 113 connected in parallel with the transistor Tr4 is 100 Ω and this resistance value decides the upper limit of the variable resistance value. Similarly, the transistor Tr5 used as the variable resistance device has a conductance gm of 70 mS, and can be varied within the range of 15 to 200 Ω.

The fixed resistance 108 connected in parallel with this transistor decides the upper limit of the variable range of the resistance value by the transistor Tr5.

The operation of the circuit in FIG. 1 will now be explained.

In this circuit, since the source electrode of the transistor Tr1 is grounded through the choke coil 104, it is driven D.C.-wise by Idss of the transistor Tr1. Even when the load 102 is a pseudo-resistance load, the D.C. bias voltage of the drain of the transistor Tr1 is constant. The output load of the gate grounded circuit using the transistor Tr1 is determined by the drain load 102, the channel resistance of the transistor Tr5 and the parallel value of the input impedance of the transistor Tr2 and the fixed resistance 108 because the capacitance value of the capacitor 116 is great. However, the input impedance of the transistor Tr2 is sufficiently greater than others, and when the choke coil, etc., is used for the load 102, the output load is substantially determined by the parallel value of the fixed resistance 108 and the channel resistance value of the transistor Tr5. Therefore, the output load can be varied by changing the potential to be applied to the gate electrode terminal 109 of the transistor Tr5, and the gain of the gate grounded circuit can thus be varied. In this case, the channel resistance of the transistor Tr5 is about 500 Ω when the drain potential of the transistor Tr1 is Vd1, the threshold voltage Vth of the transistor Tr1 is −0.6 V, the height of the potential barrier of the Schottky gate is Vb and the potential of the gate electrode terminal 109 is Vd1−Vth. The channel resistance of the transistor Tr5 can be made to be about 10 Ω when the potential of the gate electrode terminal 109 is Vd1+Vb.

In the differential amplification circuit, the source electrodes of the transistors Tr2 and Tr3 are connected to the source and drain of the transistor Tr4, respectively, and the channel resistance of the transistor Tr4 is varied by the potential applied to the gate electrode terminal 112 in the same way as in the case of the transistor Tr5. When the channel resistance of the transistor Tr4 is low, the source potentials of the transistors Tr2 and Tr3 are equal to each other and the operation is effected at the maximum gain of the differential amplification circuit. When the channel resistance of the transistor Tr4 is high, a difference occurs between the source potential of the transistor Tr3 and that of the transistor Tr2, the source potential of the transistor Tr2 changes in the same phase with respect to the high frequency signal input of the gate electrode of the transistor Tr2, negative feedback is applied and the gain of the differential amplification circuit decreases.

The overall gain of this circuit is the sum of the gain of the gate grounded circuit and that of the differential amplification circuit. Since the gain of the gate grounded circuit is proportional to the parallel value of the transistor Tr5 and the fixed resistance 108, the gain is maximum at the upper limit value determined by the resistance value of the fixed resistance 108 or in other words, when the transistor Tr5 is OFF, and becomes minimum when the transistor Tr5 has the lowest resistance value. In the differential amplification circuit, on the other hand, the gain becomes maximum when the parallel value of the transistor Tr4 and the fixed resistance 113 is minimum, that is, when the transistor Tr4 is ON, and becomes minimum at the maximum value determined by the fixed resistance 113, that is, when the transistor Tr4 is OFF. Accordingly, the overall gain of the circuit becomes maximum when the transistor Tr5 is OFF and moreover, when the transistor Tr is ON, and the gain becomes minimum when the transistor Tr5 is ON with the transistor Tr4 being OFF. The gain can be varied within the range of these maximum gain and minimum gain.

As described above, this embodiment can vary the overall gain of the circuit within the range necessary for the tuner circuit by simultaneously operating the gain control of the gate grounded circuit and that of the differential amplification circuit. Moreover, the currents flowing through the gate grounded circuit and the differential amplification circuit do not change D.C.-wise within the gain variable range described above, so that the operating points of the transistors Tr1, Tr2 and Tr3 are constant and the input impedance does not at all change. This is important in the third order distortion characteristics of the circuit, too, and there does not occur the case where the operating point of the FET enters a non-linear range within the gain variable range, as has been observed in the prior art using the dual gate FET. For this reason, the third order distortion characteristics can be improved monotonously with the decrease of the gain.

Figure 2:
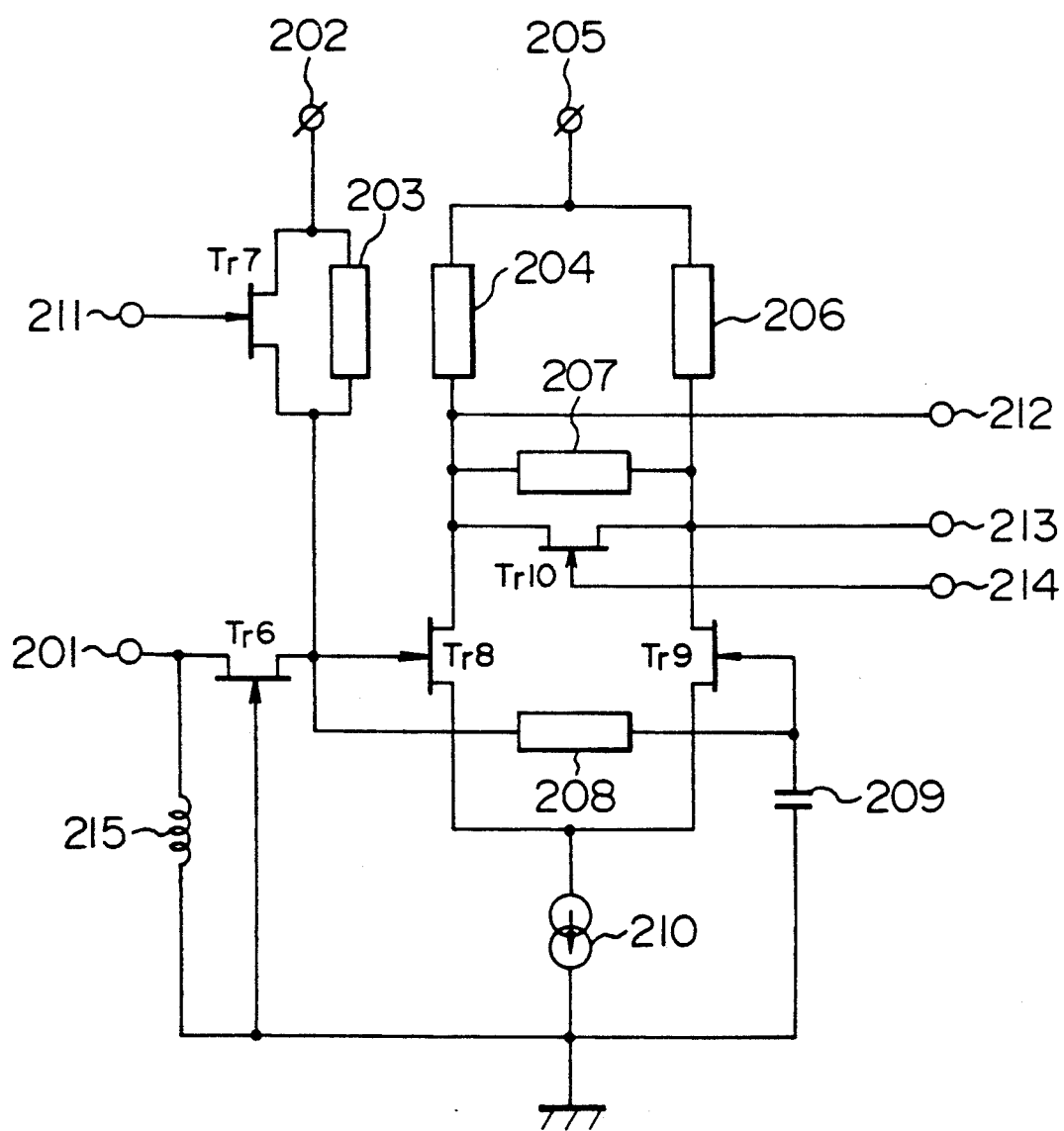
FIG. 2 is a circuit diagram of a semiconductor device for a tuner according to a second embodiment of the present invention.

The second embodiment of the present invention will be explained with reference to FIG. 2.

This semiconductor device for a tuner is a variable gain amplification circuit comprising a gate grounded circuit which uses a transistor Tr6 and a differential amplification circuit which includes transistors Tr8 and Tr9 and a constant current source 210.

The gate grounded circuit uses the source electrode of the transistor Tr6 (first FET) as its input terminal 201, connects the drain electrode to a constant voltage source 202 (first constant voltage source) through a load 203 (first load), connects a transistor Tr7 (second FET) in parallel with the load 203, and grounds the gate electrode of the transistor Tr6. A choke coil 215 is connected as a source load of the transistor Tr6.

The differential amplification circuit connects the drain electrode of the transistor Tr8 (third FET) to a constant voltage source 205 (second constant voltage source) through a load 204 (second load), connects the source electrode to the constant current source 210, further connects the drain electrode of the transistor Tr9 (fourth FET) to the constant voltage source 205 through a load 206 (third load), connects the source electrode to the constant current source, and connects a parallel circuit of a transistor Tr10 (fifth FET) and a fixed resistance 207 between the drain electrode of the transistor Tr8 and the drain electrode of the transistor Tr9.

The drain electrode of the transistor Tr6 of the gate grounded circuit is connected to the gate electrode of the transistor Tr8 of the differential amplification circuit, and a load 208 (fourth load) is interposed between the gate electrode of the transistor Tr8 and the gate electrode of the transistor Tr9. Reference numerals 211 and 214 denote gate electrode terminals, 212 and 213 denote output terminals and 209 does a capacitor for grounding high frequency-wise the gate potential of the transistor Tr9.

The transistor Tr6 has a conductance gm of 20 mS and a threshold voltage Vth of −0.4 V. The conductance gm is selected so that the input impedance becomes 50 Ω. Since the source load of the transistor Tr6 is the choke coil 215 of 500 mH, a 0 V bias is applied to the gate and a current Idss=8 mA always flows through this transistor Tr6. The drain load of the transistor Tr6 comprises a load 203 obtained by connecting in parallel a 1 mH choke coil and a 1 KΩ fixed resistance with each other and the transistor Tr7 a variable resistance device which is connected in parallel with the load 203. The transistor Tr6 is connected to a 3.0 V constant voltage source 202 through this drain load. Each of the transistors Tr8 and Tr9 has a conductance gm of 120 mS and a threshold voltage Vth of −0.4 V. The constant current source 210 is a 48 mA constant current source, and each of the drain loads 204 and 206 comprises a parallel circuit of a 1 mH choke coil and a 50 Ω resistance. The constant voltage source 205 of the differential amplification circuit is 6.0 V. The drains of the transistors Tr8 and Tr9 are connected to each other through a parallel circuit of the transistor Tr10 of the variable resistance device and the fixed resistance 207. The fixed resistance 207 is 10 KΩ and the capacitor 209 is 1000 pF.

The transistor Tr7 used as the variable resistance device has a conductance gm of 50 ms and can be varied within the range of 20 to 500 Ω by the gate bias. At this time, the 1 KΩ fixed resistance 202 connected in parallel with this transistor Tr7 decides the upper limit of the variable resistance value. Similarly, the transistor Tr10 used as the variable resistance device has a conductance gm of 70 mS and can be varied within the range of 15 to 200 Ω. The fixed resistance 207 connected in parallel with this transistor Tr10 decides the upper limit of the variable range of the resistance value by the transistor Tr10.

In this second embodiment, the overall gain of the circuit is the sum of the gain of the gate grounded circuit and the gain of the differential amplification circuit. Since the gain of the gate grounded circuit is proportional to the parallel value of the transistor Tr7 and the load 203, it becomes maximum at the upper limit value decided by the fixed resistance value of the load 203, that is, when the transistor Tr7 is OFF, and becomes minimum when the transistor Tr7 has the lowest resistance value. On the other hand, in the differential amplification circuit, the gain becomes maximum when the parallel value of the transistor Tr10 and the fixed resistance 207 is the smallest, that is, when the transistor Tr10 is ON, and becomes minimum at the maximum value decided by the fixed resistance 207, that is, when the transistor Tr10 is OFF. Accordingly, when the transistor Tr7 is OFF and moreover, when the transistor Tr10 is ON, the overall gain of the circuit becomes maximum, and when the transistor Tr7 is ON with the transistor Tr10 being OFF, the overall gain becomes minimum. The gain can be varied within the range of this minimum gain and the maximum gain.

The third embodiment of the present invention will be explained with reference to FIG. 3.

Figure 3:
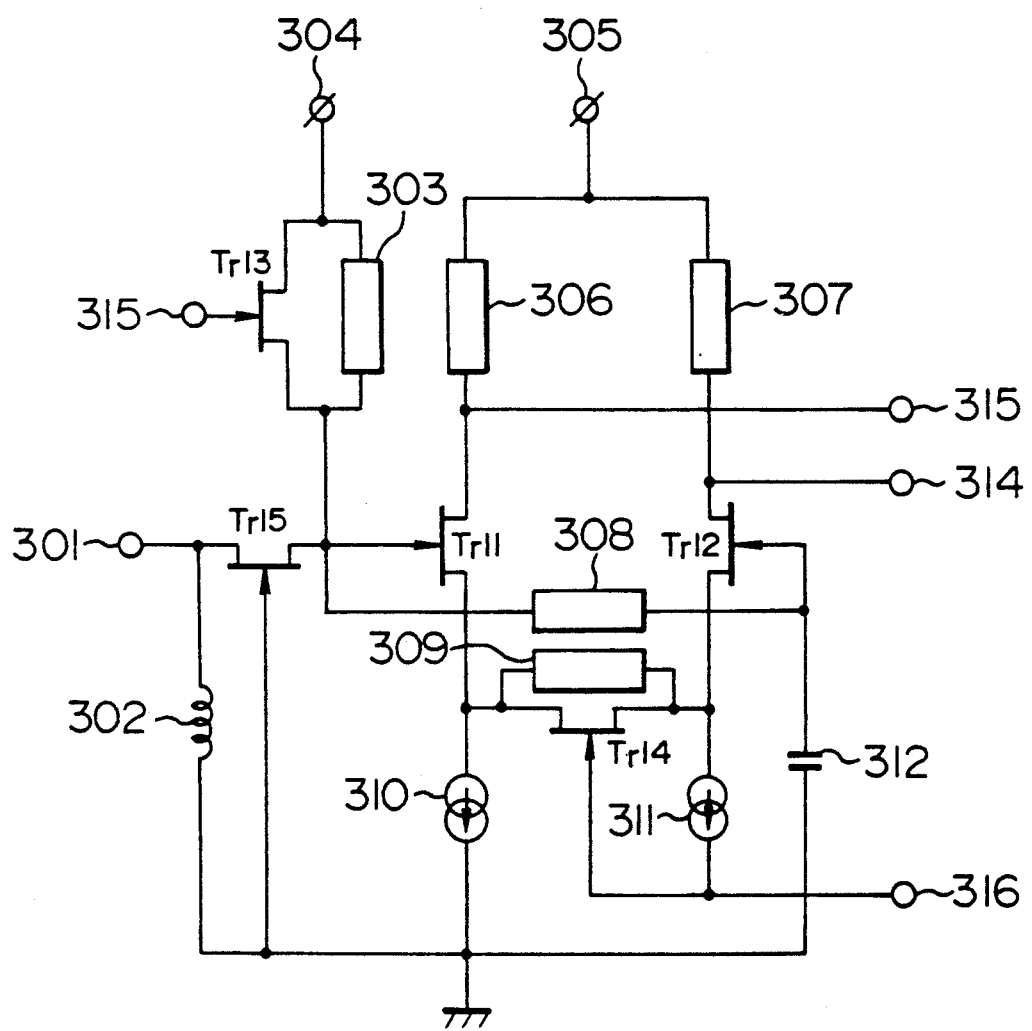
FIG. 3 is a circuit diagram of a semiconductor device for a tuner according to a third embodiment of the present invention.

FIG. 3 is a circuit diagram of the semiconductor device for a tuner according to the third embodiment of the present invention. This semiconductor device for a tuner is a variable gain amplification circuit comprising a gate grounded circuit which uses a transistor Tr15 and a differential amplification circuit which includes transistors Tr11 and Tr12 and constant current sources 310 and 311.

The gate grounded circuit uses the source electrode of the transistor Tr15 (first FET) as its input terminal 301, connects the drain electrode to the constant voltage source 304 (first constant voltage source) through a load 303 (first load), further connects the transistor Tr13 (second FET) is parallel with the load 303, and grounds the gate electrode of the transistor Tr15. A choke coil 302 is connected as the source load of the transistor Tr15.

The differential amplification circuit connects the drain electrode of the transistor Tr11 (third FET) to the constant voltage source 305 (second constant voltage source) through a load 306 (second load), connects the source electrode to the constant current source 310 (first constant current source), further connects the drain electrode of the transistor Tr12 (fourth FET) to the constant voltage source 305 through a load 307 (third load), connects the source electrode to the constant current source 311 (second constant current source), and interposes a parallel circuit of a transistor Tr14 (fifth FET) and a fixed resistance 309 between the source electrode of the transistor Tr11 and the source electrode of the transistor Tr12.

The drain electrode of the transistor Tr15 of the gate grounded circuit is connected to the gate electrode of the transistor Tr11 of the differential amplification circuit, and a load 308 (fourth load) is interposed between the gate electrode of the transistor Tr11 and the gate electrode of the transistor Tr12. Reference numerals 315 and 316 denote gate electrode terminals, 313 and 314 denote output terminals, and reference numeral 312 denotes a capacitor for grounding high frequency-wise the gate potential of the transistor Tr24.

The transistor Tr15 has a conductance gm of 20 mS and a threshold voltage Vth of −0.4 V. The conductance gm is selected so that the input impedance becomes 50 Ω. Since the source load of the transistor Tr15 is a 500 mH choke coil 302, a 0 V bias is applied to the gate and a current Idss=8 mA always flows through the transistor Tr15. The drain load of the transistor Tr15 comprises a parallel load of a 1 mH choke coil and a 1 KΩ resistance, and the transistor Tr13 as the variable resistance device connected in parallel with the former. The drain of this transistor Tr15 is connected to a 3.0 V constant voltage source 304 through this drain load. Each of the transistors Tr11 and Tr12 has a conductance gm of 120 mS and a threshold voltage Vth of −0.4 V. Each of the two constant current sources 310, 311 is a 24 mA constant current source, and each of the drain loads 306, 307 comprises a parallel circuit of a 1 mH choke coil and a 50 Ω resistance. The constant voltage source 305 of the differential amplification circuit is 6.0 V. The fixed resistance 308 is 10 KΩ and the capacitor 312 is 1000 pF.

The transistor Tr13 used as the variable resistance device has a conductance gm of 50 mS and can be varied within the range of 20 to 500 Ω. The fixed resistance of the load 303 connected in parallel with the transistor Tr13 at this time is 1 KΩ, and this resistance value decides the upper limit of the variable resistance value. Similarly, the transistor Tr14 used as the variable resistance device has a conductance gm of 70 mS and can be varied within the range of 15 to 200 Ω. Similarly, the fixed resistance 309 connected in parallel decides the upper limit of the variable range of the resistance value of the transistor Tr14.

In this third embodiment, the overall gain of the circuit is the sum of the gain of the gate grounded circuit and the gain of the differential amplification circuit. Since the gain of the gate grounded circuit is proportional to the parallel value of the transistor Tr13 and the load 303, it becomes maximum at the upper limit value decided by the fixed resistance value of the load 303, that is, when the transistor Tr13 is OFF, and is minimum when the transistor Tr13 has the smallest resistance value. On the other hand, the gain of the differential amplification circuit becomes maximum when the parallel value of the transistor Tr14 as the variable resistance device and the fixed resistance 309 is the smallest, that is, when the transistor Tr14 is ON, and becomes minimum at the greatest value decided by the fixed resistance 309, that is, when the transistor Tr14 is OFF. Therefore, the overall gain of the circuit becomes minimum when the transistor Tr13 is OFF and moreover, when the transistor Tr14 is ON, and becomes minimum when the transistor Tr13 is ON with the transistor Tr14 being OFF. The gain can be varied within the range of these minimum and maximum values.

The characteristics of the semiconductor device for a tuner, which has been explained in the foregoing first to third embodiments and which is the variable gain amplification circuit, will be explained with reference to FIG. 4.

Figure 4:
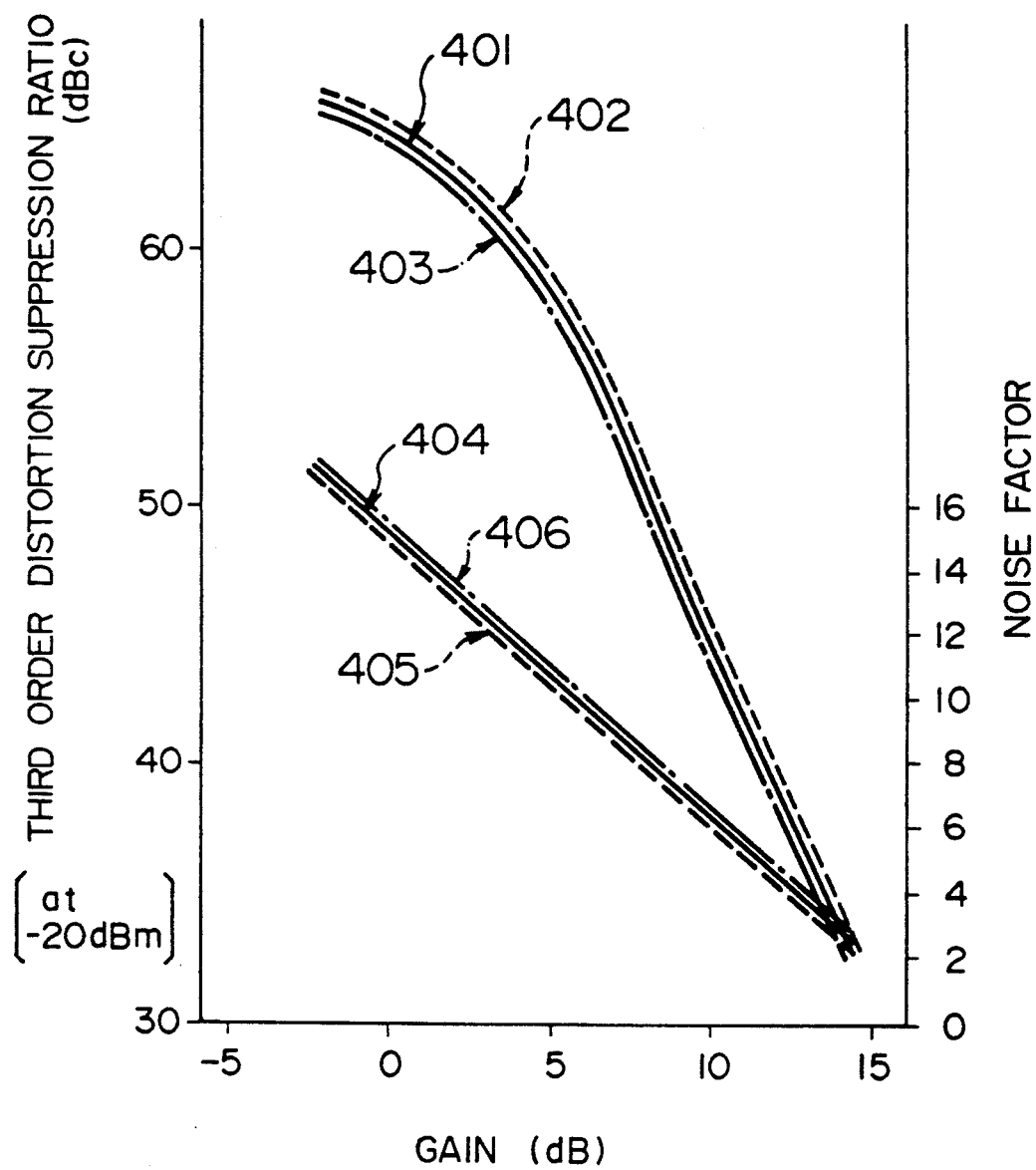
FIG. 4 is a diagram showing a suppression ratio of third order distortion to the gain of the semiconductor device for a tuner according to the first to third embodiments of the present invention and actually measured values of noise factors.

FIG. 4 shows the suppression ratio of third order distortion with respect to the gain and the actually measured values of the noise factors. In this diagram, the abscissa represents the gain (dB) of the amplification circuit and the ordinate represents the suppression ratio (dBc) of the third order distortion and the noise factor dB). Solid lines 401 and 404 in the diagram represent the suppression ratios of the third order distortion and the actually measured value in the first embodiment, respectively, dash lines 402 and 405 represent the suppression ratio of the third order distortion and the actually measured value of the noise factor in the second embodiment, and one-dot-chain lines 403 and 406 represent the suppression ratio of the third order distortion and the actually measured value of the noise factor in the third embodiment, respectively. Though some differences are observed in the suppression ratios of the third order distortion and the noise factors between these embodiments, these differences are believed to result from substrates used for measurement and evaluation.

The maximum gain of the respective amplification circuits are from 14.2 to 14.8 dB and the suppression ratios of the third order distortion and the noise factors at this time are 31 to 32 dBc and 2.5 to 3.0 dB, respectively. The minimum gains are from −5.0 to −4.8 dB and the suppression ratios of the third order distortion at this time are 64.5 to 66.6 dBc. Also, the noise factors at this time are 18.0 to 18.5 dB. Particularly, the third order distortion linearly decreases with a gradient of about 3 times with the decrease of the gain in the range of from about 5 to about 15 dB.

When the circuit which linearly improves the third order distortion to the decrease of the gain is used for a variable gain amplification circuit of a TV tuner, the gain is reduced at the time of the excessive input and at the same time, the third order distortion can be improved. Therefore, not only the saturation of the output signal but also the cross modulation necessary for the multi-channel TV tuner can be improved. It can thus be appreciated that the semiconductor devices for a tuner according to the first to third embodiments of the present invention are suitable as the variable gain amplification circuit of the TV tuner.

Figure 5:
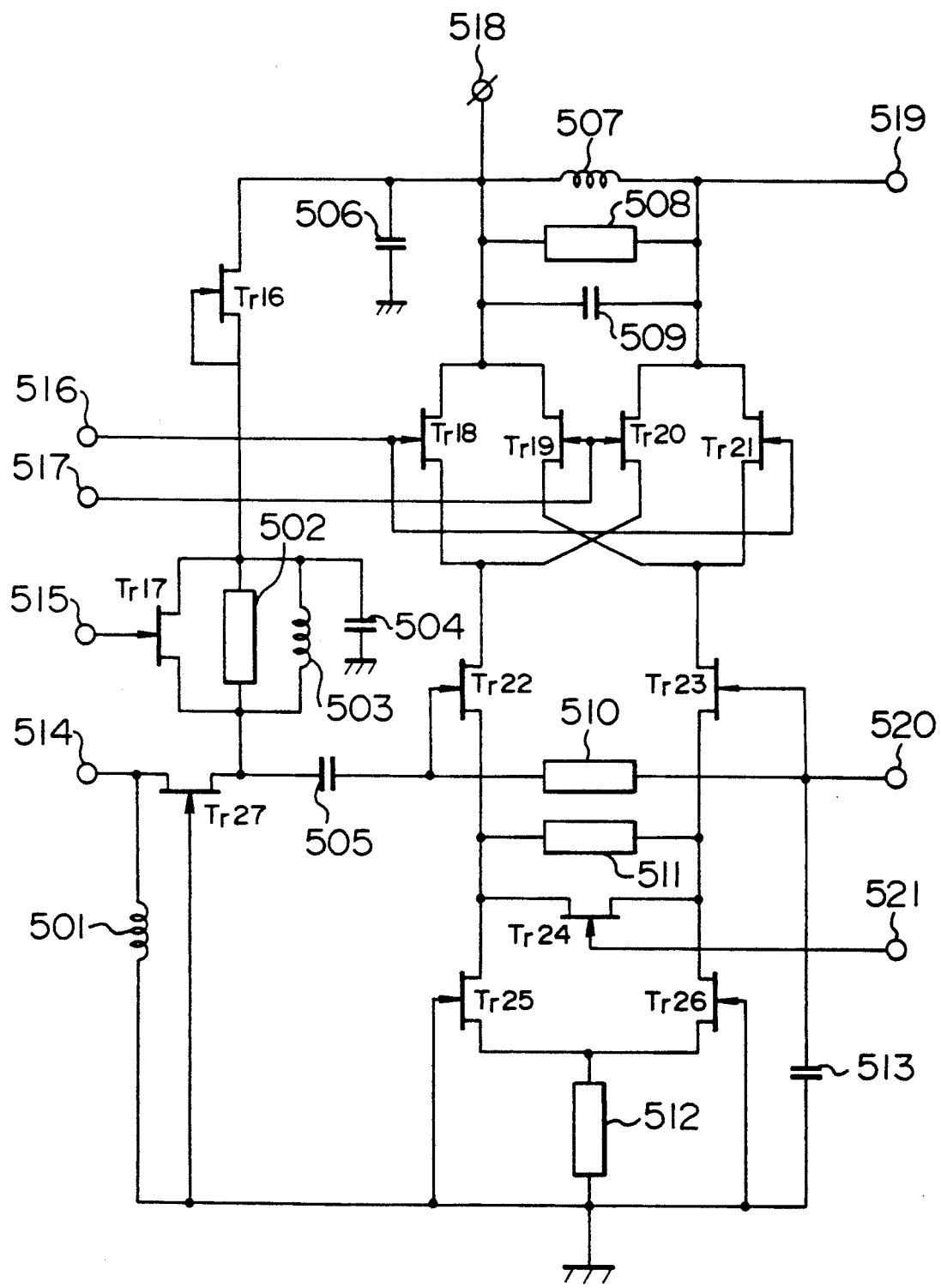
FIG. 5 is a circuit diagram of a semiconductor device for a tuner according to a fourth embodiment of the present invention.

The fourth embodiment of the present invention will be explained with reference to FIG. 5.

This semiconductor device for a tuner is a variable conversion gain mixer circuit obtained by connecting a gate grounded circuit which uses a transistor Tr27, an RF buffer circuit as a differential amplification circuit which includes transistors Tr22, Tr23 and transistors Tr25, Tr26 as a constant current source, and a double-balanced mixer circuit to one another.

The gate grounded circuit uses the source electrode of the transistor Tr27 (first FET) as an RF input terminal 514 (input terminal), connects the drain electrode of the transistor Tr27 to a constant voltage source 518 through a parallel circuit of a resistance load 502 and a coil 503 (first load), connects in parallel the transistor Tr17 (second FET) used as a variable resistance device to the first load (502, 503), and grounds the gate electrode of the transistor Tr27. Reference numeral 501 denotes a coil. A transistor Tr16 is an active load of the gate grounded circuit. When a parallel load of the transistor Tr17, the resistance load 502 and the coil 503 is connected in series with the transistor Tr16 as the active load, the gain can be varied by the variable load of the gate grounded circuit. Reference numeral 515 denotes an AGC terminal of the transistor Tr17 used as the variable resistance device.

The RF buffer circuit connects the source electrode of the transistor Tr22 (third FET) to the transistor Tr25 (first constant current source), connects the source electrode of the transistor Tr23 (fourth FET) to the transistor Tr26 (second constant current source), and interposes a parallel circuit of a transistor Tr24 (fifth FET) and a fixed resistance 511 between the source electrode of the transistor Tr22 and the source electrode of the transistor Tr23, forming thereby a differential amplification circuit. The transistor Tr24 is used as a variable resistance device, and the fixed resistance 511 connected in parallel with the transistor Tr24 decides the upper limit of the resistance value of the transistor Tr24.

The double-balanced mixer circuit connects the drain electrode of the transistor Tr18 (sixth FET) and the drain electrode of the transistor Tr19 (seventh FET) to a constant voltage source 518, connects the drain electrode of the transistor Tr20 (eighth FET) and the drain electrode of the transistor Tr21 (ninth FET) to the constant voltage source 518 through a drain load (second load) comprising a parallel circuit of the coil 507, the resistance 508 and a capacitor 509, connects the source electrode of the transistor Tr18 to the source electrode of the transistor Tr20, connects the source electrode of the transistor Tr19 to the source electrode of the transistor Tr21, uses the gate electrode of the transistor Tr18 and the gate electrode of the transistor Tr21 as a first input terminal 516 of a local oscillation signal, and uses the gate electrode of the transistor Tr19 and the gate electrode of the transistor Tr20 as a second input terminal 517 of the local oscillation signal. The parallel circuit of the coil 507, the resistance 508 and the capacitor 509 constitutes an LC resonance circuit so as to tune with an IF frequency. In this embodiment, parameters are so set as to resonate with 400 MHz. Reference numeral 519 denotes an IF output terminal.

A fixed resistance 510 (third load) is interposed between the gate electrode of the transistor Tr22 and the gate electrode of the transistor Tr23, and the connection between the double-balanced mixer circuit and the RF buffer circuit is established by connecting the source electrodes of the transistors Tr18, Tr20 to the drain electrode of the transistor Tr22, and connecting the source electrodes of the transistors Tr19, Tr20 to the drain electrode of the transistor Tr23. The capacitor 505 which connects the gate grounded circuit to the differential amplification circuit forms a peaking circuit in cooperation with the coil 503 connected to the drain of the transistor Tr27, so as to improve the frequency characteristics at the time of the high gain of the gate grounded circuit, etc.

Figure 6:
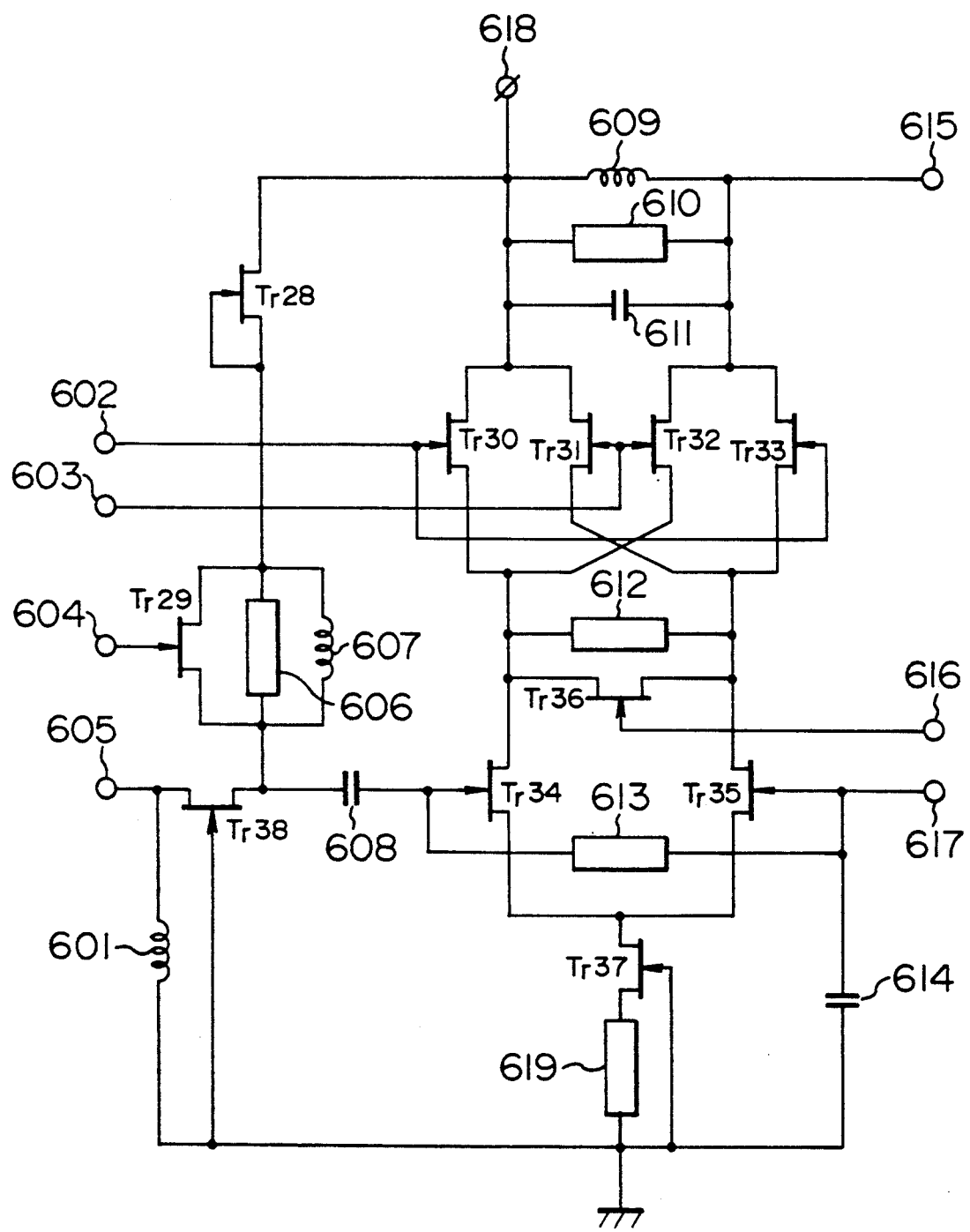
FIG. 6 is a circuit diagram of a semiconductor device for a tuner according to a fifth embodiment of the present invention.

The fifth embodiment of the present invention will be explained with reference to FIG. 6.

The semiconductor device for a tuner is a variable conversion gain mixer circuit obtained by connecting a gate grounded circuit which uses a transistor Tr38, an RF buffer circuit as a differential amplification circuit which includes transistors Tr34, Tr35 and transistor Tr37 as a constant current source, and a double-balanced mixer circuit.

In the same way as in the fourth embodiment, the gate grounded circuit uses the source electrode of the transistor Tr38 (first FET) as an RF input terminal 605 (input terminal), connects the drain electrode of the transistor Tr38 to a constant voltage source 618 through a parallel circuit of a resistance load 606 and a coil 607 (first load), connects a transistor Tr29 (second FET) used as a variable resistance device in parallel with the first load (606, 607), and grounds the gate electrode of the transistor Tr38. Reference numeral 601 denotes a coil. A transistor Tr28 is an active load to the gate grounded circuit, and the gain is varied by varying the load of the gate grounded circuit by connecting the transistor Tr29 and the parallel load of the resistance load 606 and the coil 60 in series with the transistor Tr28 as the active load. Reference numeral 604 denotes an AGC terminal of a transistor Tr29 which is used as a variable resistance device.

The RF buffer circuit is a differential amplification circuit which connects the source electrode of a transistor Tr34 (third FET) and the source electrode of a transistor Tr35 (fourth FET) to a transistor Tr37 (constant current source), and interposes a parallel circuit of a transistor 36 (fifth FET) and a fixed resistance 612 between the drain electrode of the transistor Tr34 and the drain electrode of the transistor Tr35. The transistor Tr36 is used as a variable resistance device and the fixed resistance 612 connected in parallel with this transistor Tr36 decides the upper limit of the resistance value of the transistor Tr36.

In the same way as in the fourth embodiment, the double-balanced mixer circuit connects the drain electrode of the transistor Tr30 (sixth FET) and the drain electrode of the transistor Tr31 (seventh FET) to a constant voltage source 518, connects the drain electrode of the transistor Tr32 (eighth FET) and the drain electrode of a transistor Tr33 (ninth FET) to a constant voltage source 618 through a drain load (second load) comprising a parallel circuit of a coil 609, a resistance 610 and a capacitor 611, connects the source electrode of the transistor Tr30 to the source electrode of the transistor Tr32, connects the source electrode of the transistor Tr31 to the source electrode of the transistor Tr33, uses the gate electrode of the transistor Tr31 and the gate electrode of the transistor Tr30 as a first input terminal 602 of a local oscillation signal, and uses the gate electrode of the transistor Tr31 and the gate electrode of the transistor Tr32 as a second input terminal 603 of the local oscillation signal. The parallel circuit of the coil 609, the resistance 610 and the capacitor 611 as the drain load constitute an LC resonance circuit and tune with an IF frequency. In this embodiment, parameters are set as to resonate with 400 MHz. Reference numeral 615 denotes an IF output terminal.

A fixed resistance 613 (third load) is interposed between the gate electrode of the transistor Tr34 and the gate electrode of the transistor Tr35, and the connection between the double-balanced mixer circuit and the RF buffer circuit is established by connecting the source electrodes of the transistors Tr30, Tr32 to the drain electrode of the transistor Tr34 and connecting the source electrodes of the transistors Tr31, Tr33 to the drain electrode of the transistor Tr35. The capacitor 608 for connecting the source grounded circuit to the differential amplification circuit constitutes a peaking circuit in cooperation with the coil 607 which is connected to the drain of the transistor Tr38 and improves the frequency characteristics at the time of the high gain of the gate grounded circuit.

Figure 7:
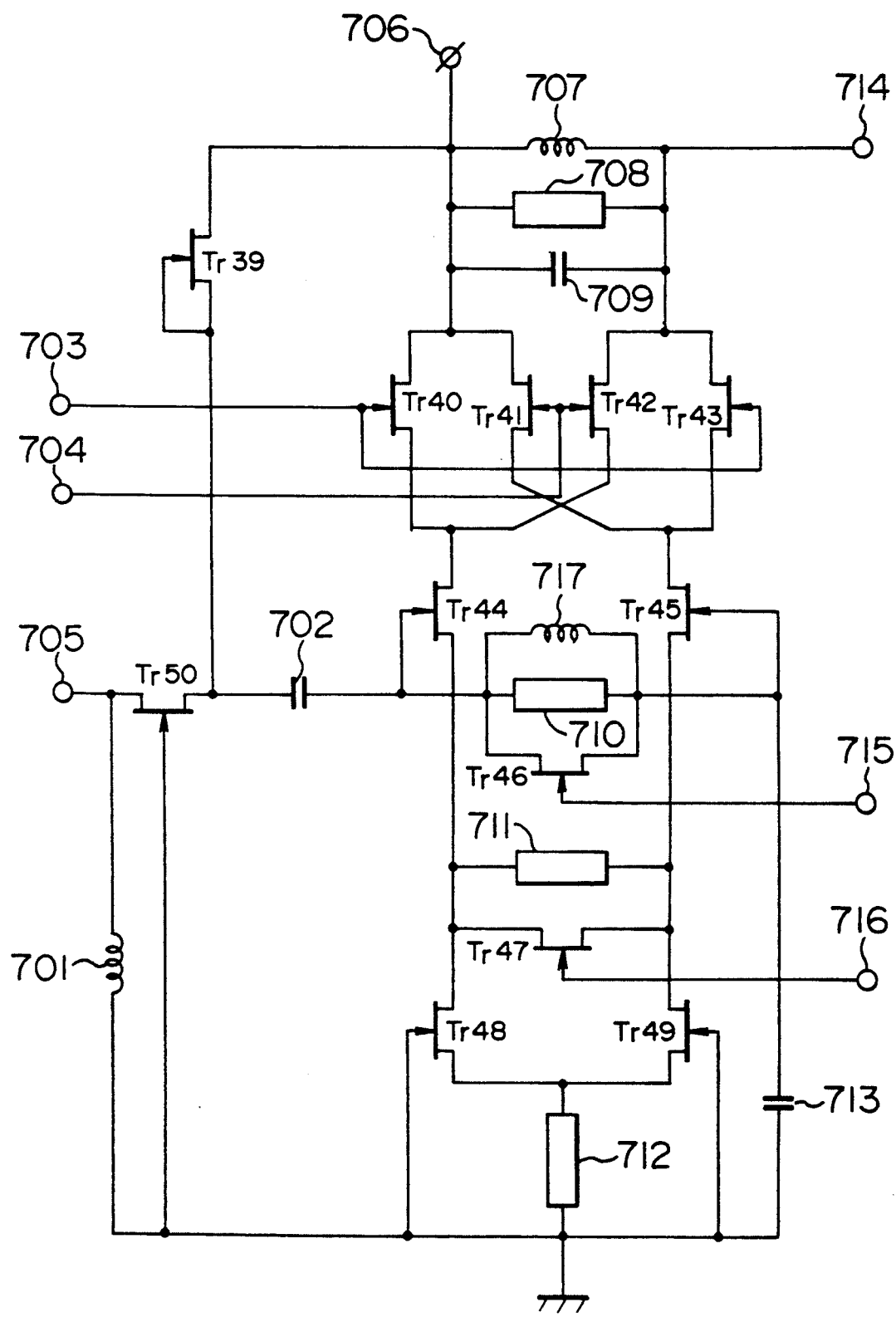
FIG. 7 is a circuit diagram of a semiconductor device for a tuner according to a sixth embodiment of the present invention.

The sixth embodiment of the present invention will be explained with reference to FIG. 7.

This semiconductor device for a tuner is a variable conversion gain mixer circuit which is obtained by connecting a gate grounded circuit using a transistor Tr50, a differential amplification circuit as an RF buffer circuit including transistors Tr44, Tr45 and transistors Tr48, Tr49 as a constant current source, and a double-balanced mixer circuit.

The gate grounded circuit uses the source electrode of a transistor Tr50 (first FET) as its RF input terminal 705 (input terminal), connects the drain electrode of the transistor Tr50 to a constant current source 706 through a transistor Tr39 (first load), and grounds the gate electrode of the transistor Tr50. Reference numeral 701 denotes a coil, and a transistor Tr39 as a drain load is an active load of the gate grounded circuit. However, an actual load impedance is determined by the parallel value of a transistor Tr46 (ninth FET) used as a variable resistance device, a parallel load of a resistance load 710 and a coil 717, and the active load by the transistor Tr39. Accordingly, the gain of the gate grounded circuit is varied by the AGC voltage applied to the AGC terminal 715 of the transistor Tr46.

The RF buffer circuit is a differential amplification circuit which connects the source electrode of the transistor Tr44 (second FET) to the transistor Tr48 (first constant current source), connects the source electrode of the transistor Tr45 (third FET) to the transistor Tr49 (second constant current source), and interposes a parallel circuit of the transistor Tr47 (fourth FET) and a fixed resistance 711 between the source electrode of the transistor Tr44 and the source electrode of the transistor Tr45. The transistor Tr47 is used as a variable resistance device, and the fixed resistance 711 connected in parallel with the transistor Tr47 decides the upper limit of the resistance value of the transistor Tr47.

The double-balanced mixer circuit connects the drain electrode of the transistor Tr40 (fifth FET) and the drain electrode of the transistor Tr41 (sixth FET) to the constant voltage source 706, connects the drain electrode of the transistor Tr42 (seventh FET) and the drain electrode of the transistor Tr43 (eighth FET) to the constant voltage source 706 through a drain load (second load) comprising the parallel circuit of the coil 707, a resistance 708 and a capacitor 709, connects the source electrode of the transistor Tr40 to the source electrode of the transistor Tr42, connects the source electrode of the transistor Tr41 to the source electrode of the transistor Tr42, uses the gate electrode of the transistor Tr40 and the gate electrode of the transistor Tr43 as a first input terminal 703 of a local oscillation signal, and uses the gate electrode of the transistor Tr41 and the gate electrode of the transistor Tr42 as a second input terminal 704 of the local oscillation circuit. The parallel circuit of the coil 707, the resistance 708 and the capacitor 709 constitutes an LC resonance circuit and tunes with an IF frequency. In this embodiment, parameters are so set as to resonate with 400 MHz. Reference numeral 714 represents an IF output terminal.

A transistor Tr46, a resistance load 710 and a coil 717 are connected in parallel between the gate electrode of the transistor Tr44 and the gate electrode of the transistor Tr45, and the connection between the double-balanced mixer circuit and the RF buffer circuit is established by connecting the source electrodes of the transistors Tr40, Tr42 to the drain electrode of the transistor Tr44 and connecting the source electrodes of the transistors Tr41, Tr43 to the drain electrode of the transistor Tr45. The capacitor 702 for connecting the gate grounded circuit with the differential amplification circuit forms a peaking circuit in cooperation with the coil interposed between the gates of the transistors Tr44, Tr45 and improves the frequency characteristics at the time of the high gain of the gate grounded circuit.

The characteristics of the semiconductor device for a tuner which has been explained in connection with the fourth to sixth embodiments and a variable conversion gain mixer circuit will be explained with reference to FIG. 8.

Figure 8:
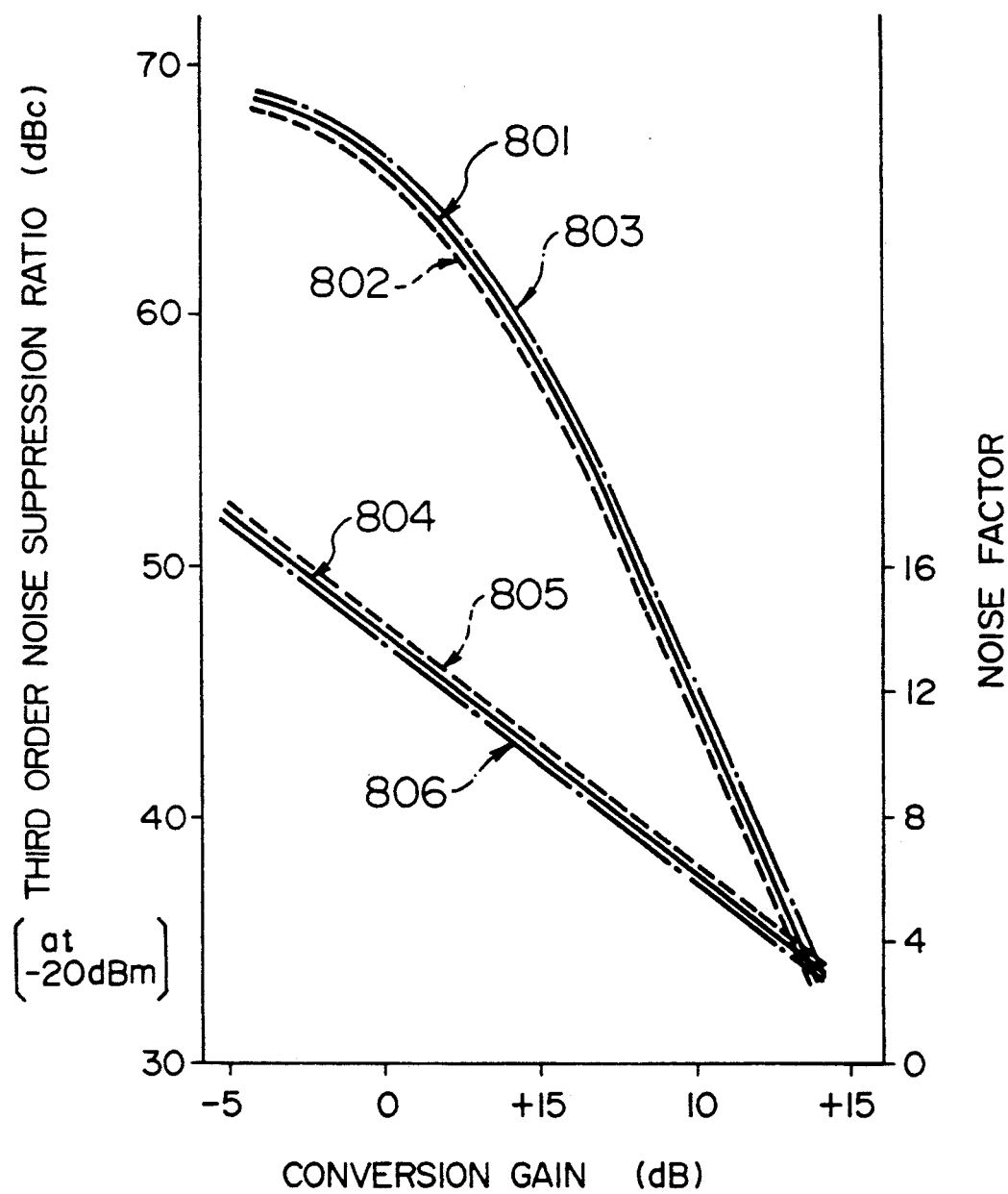
FIG. 8 is a diagram showing a suppression ratio of third order distortion to the conversion gain of the semiconductor device for a tuner according to the fourth to sixth embodiments of the present invention and actually measured values of noise factors.

FIG. 8 shows a suppression ratio of third order distortion with respect to the conversion gain and actually measured values of noise factors. In the diagram, the abscissa represents the conversion gain (dB) of the mixer circuit and the ordinate does the suppression ratio (dBc) of the third order distortion and the noise factor (dB). Solid lines 801 and 804 in the diagram represent the suppression ratio of the third order distortion and the actually measured value of the noise factor in the fourth embodiment, respectively, dash lines 802 and 805 represent the suppression ratio of the third order distortion and the actually measured values of the noise factor in the fifth embodiment, respectively, and one-dot-chain lines 803 and 806 represent the suppression ratio of the third order distortion and the actually measured value of the noise factor, respectively. Though some differences of the suppression ratios of the third order distortion and the actually measured values are observed between these embodiment, the differences are believed to be an measurement error and the characteristics of each mixer circuit are believed substantially the same.

The maximum gain of each mixer circuit is 14.2 to 14.8 dB. At this time, the suppression ratio of the third order distortion is 31 to 32 dBc and the noise factor is 3.0 to 3.9 dB. The minimum conversion gain is −5.0 to −4.8 dB. At this time, the suppression ratio of the third order distortion is 64.5 to 66.5 dB and the noise factor is 17.5 to 18.0 dB. Particularly when the gain is within the range of about 5 to about 15 dB, the third order distortion decreases linearly with a gradient of about three times with respect to the decrease of the conversion gain.

When the mixer circuit, which characterizingly improves linearly the third order distortion with respect to the decrease of the conversion gain, is used for a TV tuner, it lowers the conversion gain at the time of the excessive input and at the same time, can improve the third order distortion. Accordingly, the mixer circuit can prevent not only the saturation of the output signal but also the cross modulation necessary for a multichannel TV tuner. It can thus be appreciated that the semiconductor devices for a tuner according to the fourth to sixth embodiments of the present invention are extremely suitable as the variable conversion gain mixer circuit for the TV tuner.

The seventh embodiment of the present invention will be explained with reference to the drawing.

Figure 9:
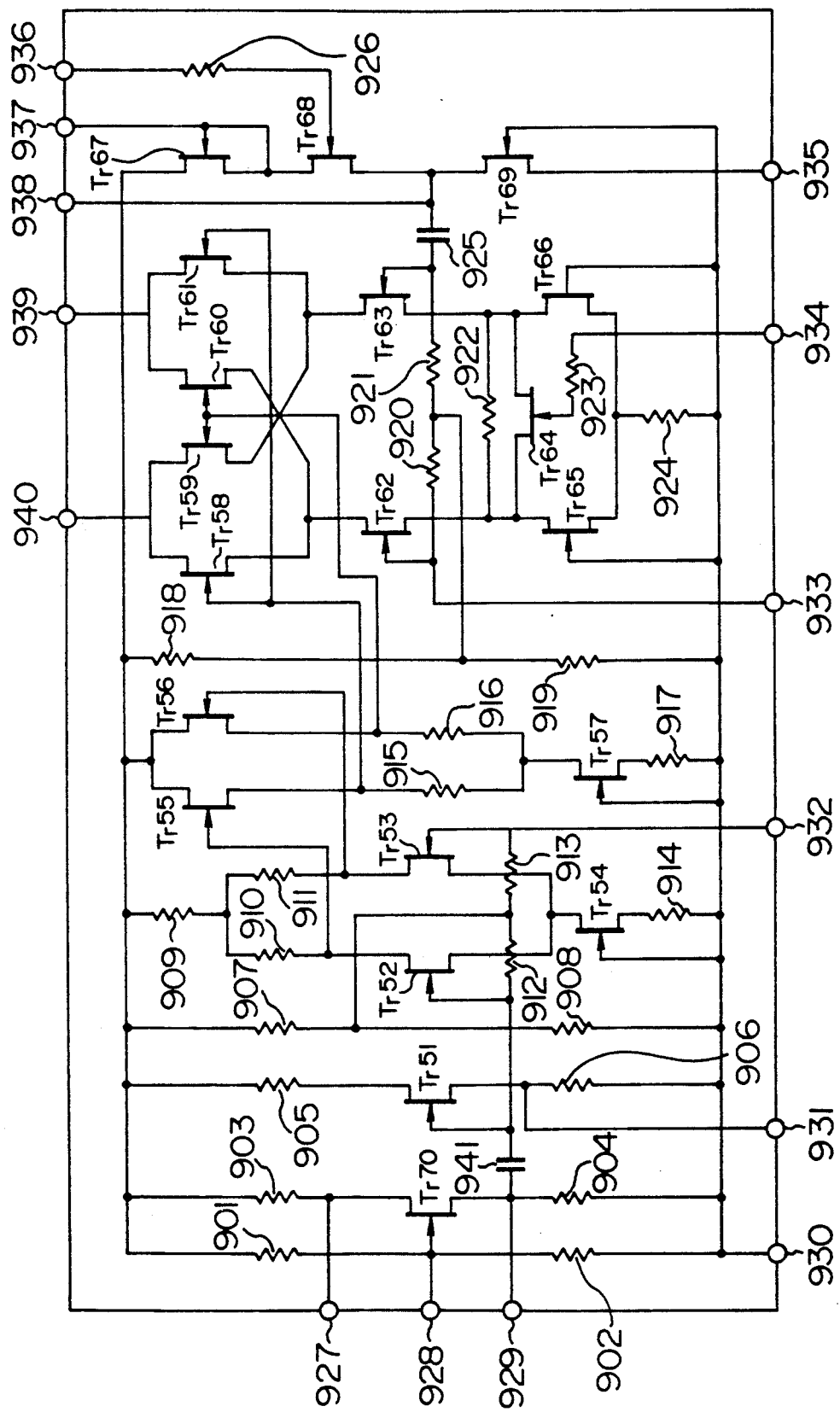
FIG. 9 is a circuit diagram of a variable conversion gain type mixer oscillator IC formed by integrating the semiconductor device for a tuner of the fourth embodiment, an LO oscillator and an LO buffer circuit on one chip.

FIG. 9 is a circuit diagram of a variable conversion gain mixer oscillator IC obtained by integrating the variable conversion gain mixer circuit as the semiconductor device for a tuner according to the fourth embodiment, an LO oscillator and an LO buffer circuit by the use of a GaAs semiconductor.

A transistor Tr69 is a gate grounded circuit, and reference numeral 935 denotes an input terminal. A transistor Tr67 is an active load, and reference numerals 937 and 938 denote a terminal for connecting a coil outside the IC. A transistor Tr68 is a variable resistance device, and reference numeral 936 denotes an AGC terminal of the gate grounded circuit.

The RF buffer circuit comprises transistors Tr62, Tr63 and transistors Tr65, Tr66 as a constant current source. Transistor Tr64 and a resistance device 922 are devices for variable gain, and reference numeral 934 denotes an AGC terminal for the RF buffer circuit.

The double-balanced mixer circuit comprises transistors Tr58, Tr59, Tr60 and Tr61. A capacitor 925 is integrated in order to improve frequency characteristics.

A transistor Tr70 is a transistor for the LO oscillation circuit and is connected to an external resonance circuit from terminals 927, 928 and 929. A transistor Tr51 is an output buffer circuit for guiding the LO signal to a PLL circuit, and reference numeral 931 denotes an output terminal. Transistors Tr52, Tr53 and Tr54 constitute a differential amplifier for converting the LO signal to a balance signal and at the same time, for amplifying it. Transistors Tr55, Tr56 and Tr57 constitute an LO buffer circuit for supplying the LO signal to the double-balanced mixer circuit. Reference numeral 940 denotes a power source terminal, 930 is a ground terminal, 932 and 933 are terminals for grounding A.C.-wise the circuit through the capacitor, 902 to 924 and 906 are resistances, 939 is a terminal and 941 is a capacitor.

Figure 10:
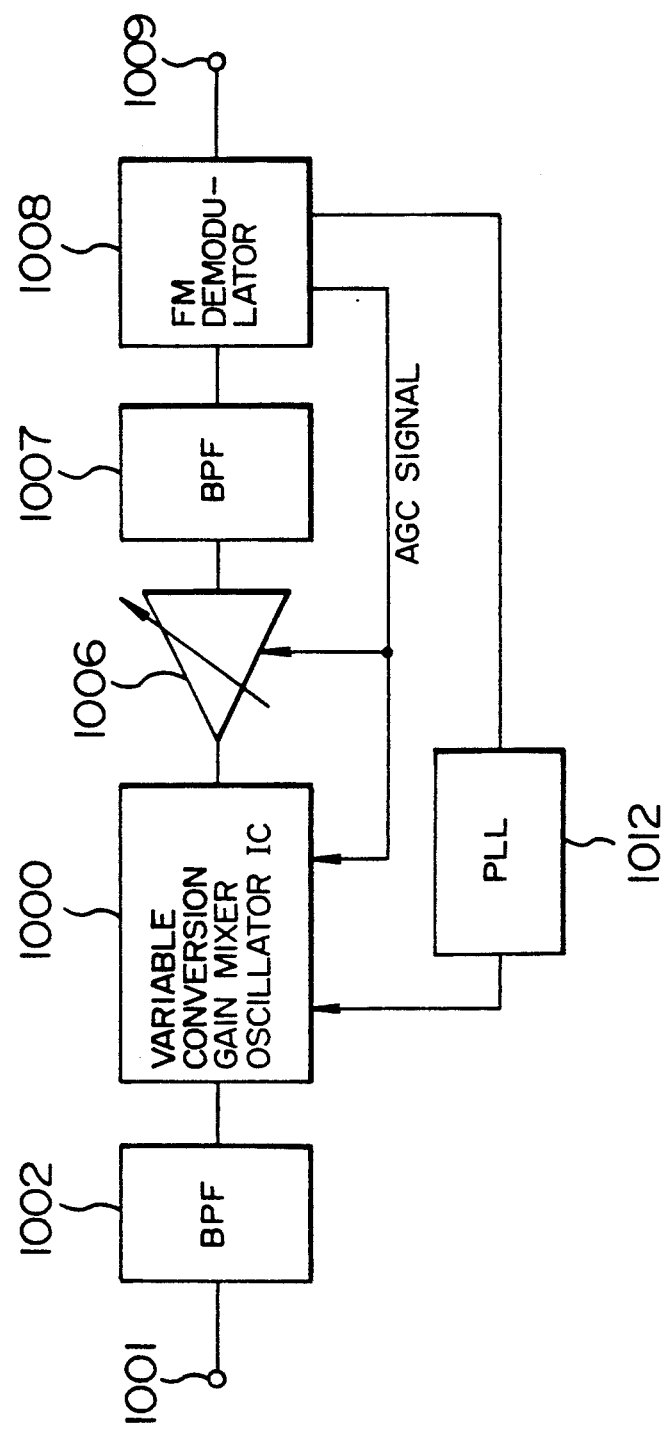
FIG. 10 is a block diagram of a tuner according to one embodiment of the present invention.
Figure 11:
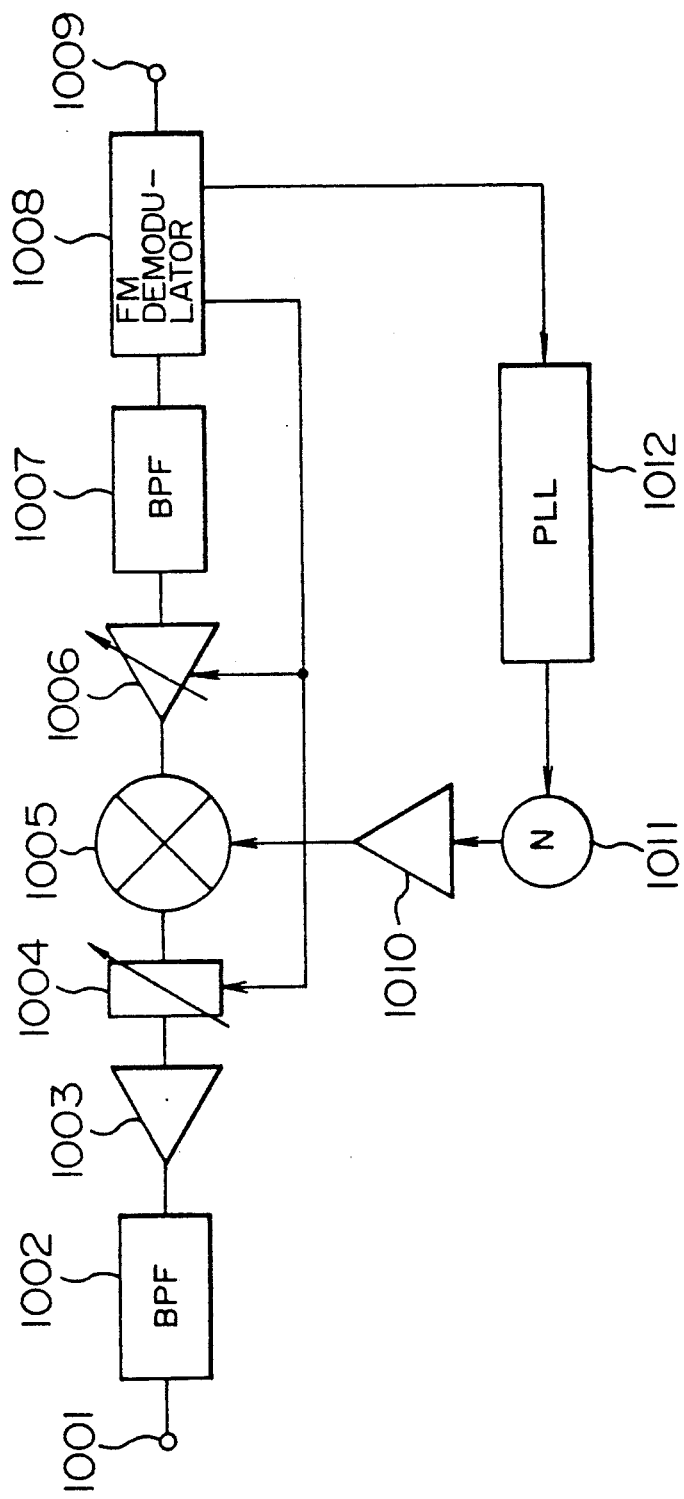
FIG. 11 is a block diagram of a conventional TV tuner for satellite broadcasting.
Figure 12A:
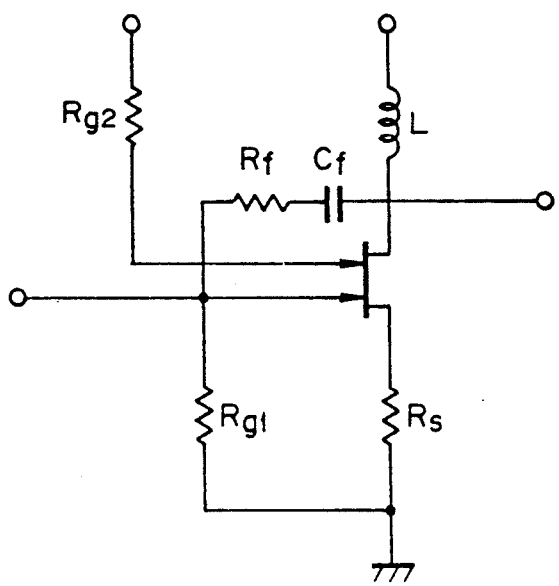
FIG. 12A is a circuit diagram of a variable gain amplifier using a dual gate FET according to the prior art.
Figure 12B:
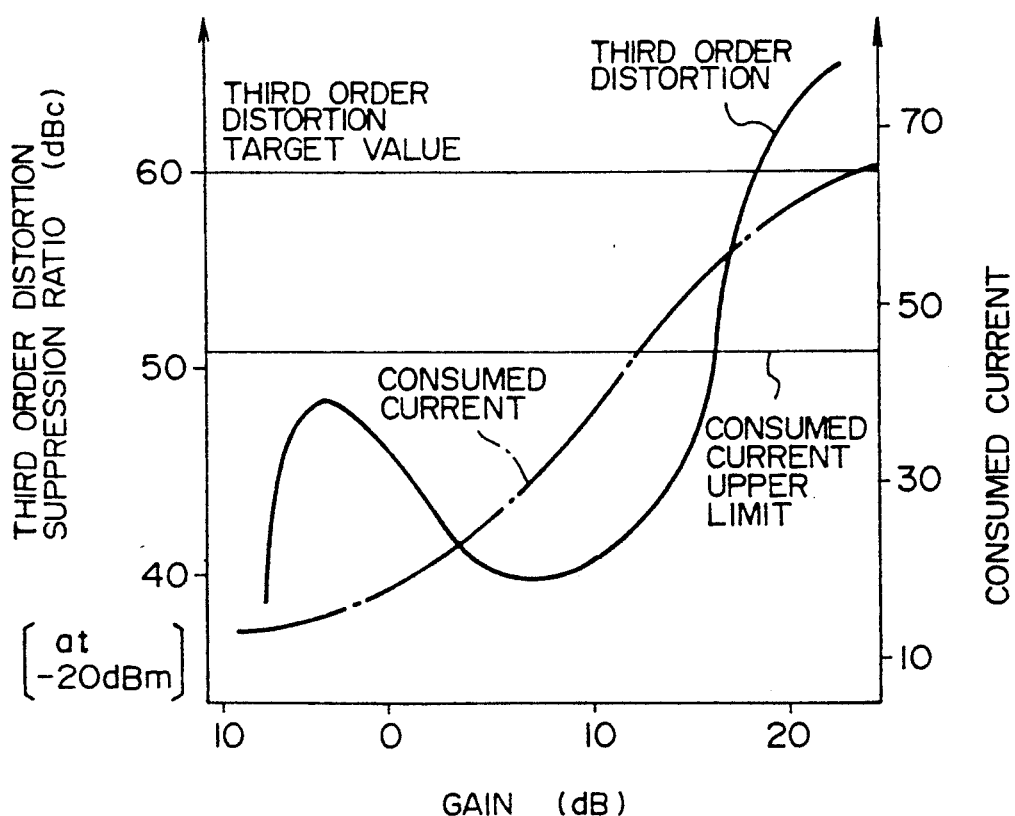
FIG. 12B is a diagram showing third order distortion characteristics to the gain of a variable gain amplification circuit using the dual gate FET shown in FIG. 12A and current consumption characteristics.

FIG. 10 shows a TV tuner for satellite broadcasting which has the variable conversion gain mixer oscillator IC shown in FIG. 9 mounted thereto. Reference numeral 901 denotes an input terminal. In the case of satellite broadcasting, it is an input terminal of a broadcasting signal outputted from an outdoor with and having a first intermediate frequency of 950 to 1750 MHz. In FIG. 10, reference numeral 1000 denotes the variable conversion gain mixer oscillator IC shown in FIG. 9, 1001 is an input terminal 1002 is band-pass filter, 1006 is a variable gain IF amplifier, 1007 is a band-pass filter of an IF frequency, and 1008 is an FM demodulator. Reference numeral 1012 denotes a phase-locked loop (PLL) circuit for stabilizing the LO frequency and 1009 is an output terminal of a video signal.

As described above, according to this embodiment, the RF amplifier 1003, variable attenuator 1004, mixer circuit 1005, local oscillation circuit (OSC) 1011 and LO buffer circuit 1010 in accordance with the structure of the conventional TV tuner are integrated into one chip and can be mounted as the variable conversion gain mixer oscillator IC shown in FIG. 10 to the TV tuner. As a result, the attenuator circuit which has been believed difficult to integrate by GaAs IC in the past can be equivalently integrated and moreover, the wasteful circuit arrangement of the prior art in which the signal is amplified by the broadband amplifier RF 1003 and is then damped by the variable attenuator 1004 can be eliminated. Furthermore, the size of the TV tuner for satellite broadcasting can be reduced and moreover, the number of components can drastically be reduced.

Furthermore, the variable conversion gain mixer oscillator IC1000 including the semiconductor device for a tuner according to the fourth embodiment has excellent characteristics in that the third order distortion characteristics with respect to the conversion gain are linearly improved with the decrease of the conversion gain. As a result, the third order distortion suppression ratio of at least 60 dBc can be secured within the range of the input signal intensity of up to 0 dBm, and a high performance tuner having both low noise factor and low third order distortion characteristics can be accomplished.

The semiconductor device for a tuner according to the present invention can vary the overall gain of the circuit or the conversion gain within a necessary range by operating simultaneously the gain control by the FETs used as the variable resistance devices. Moreover, since the currents flowing through the gate grounded circuit and through the differential amplification circuit do not change D.C.-wise within the gain variable range, the third order distortion characteristics can be improved monotonously with the decrease of the gain or the conversion gain. As a result, the now noise factor, the low third order distortion characteristics and low power consumption can be satisfied simultaneously.

When the semiconductor device according to the present invention is mounted, the tuner of the present invention can satisfy the low noise characteristics and low power consumption and can drastically reduce the number of components. Therefore, the tuner of the present invention can eliminate labor during the assembly process and can accomplish scale-down of the apparatus.

We claim:

1. A semiconductor device for a tuner comprising:
   a gate grounded circuit using a source electrode of a first FET as an input terminal, connecting a drain electrode of said first FET to a first constant voltage source through a first load and grounding a gate electrode of said first FET; and
   a differential amplification circuit connecting a drain electrode of a second FET to a second constant voltage source through a second load, connecting the source electrode of said second FET to a first constant current source, connecting a drain electrode of a third FET to said second constant voltage source through a third load, connecting a source electrode of said third FET to a second constant current source, and interposing a fourth FET between the source electrode of said second FET and the source electrode of said third FET;
   wherein the drain electrode of said first FET of said gate grounded circuit is connected to the gate electrode of said second FET of said differential amplification circuit, and a fifth FET is interposed between the gate electrode of said second FET and the gate electrode of said third FET.

2. A semiconductor device for a tuner comprising:
   a gate grounded circuit using a source electrode of a first FET as an input terminal, connecting a drain electrode of said first FET to a first constant voltage source through a first load, connecting said second FET in parallel with said first load, and grounding a gate electrode of said first FET; and a differential amplification circuit connecting a drain electrode of a third FET to a second constant voltage source through a second load, connecting a source electrode of said third FET to a constant current source, connecting a drain electrode of a fourth FET to said second constant voltage source through a third load, connecting a source electrode of said fourth FET to said constant current source, and interposing a fifth FET between the drain electrode of said third FET and the drain electrode of said fourth FET;

wherein the drain electrode of said first FET of said gate grounded circuit is connected to the gate electrode of said third FET of said differential amplification circuit, and a fourth load is interposed between the gate electrode of said third FET and the gate electrode of said fourth FET.

3. A semiconductor device for a tuner comprising:

a gate grounded circuit using a source electrode of a first FET as an input terminal, connecting a drain electrode of said first FET to a first constant voltage source through a first load, connecting a second FET in parallel with said first load, and grounding a gate electrode of said first FET; and a differential amplification circuit connecting a drain electrode of a third FET to a second constant voltage source through a second load, connecting a source electrode of said third FET to a first constant current source, connecting the drain electrode of a fourth FET to said second constant voltage source through a third load, and interposing a fifth FET between the source electrode of said third FET and the source electrode of said fourth FET;

wherein the drain electrode of said first FET of said gate grounded circuit is connected to the gate electrode of said third FET of said differential amplification circuit, and a fourth load is interposed between the gate electrode of said third FET and the gate electrode of said fourth FET.

4. A semiconductor device for a tuner comprising:

a gate grounded circuit using a source electrode of a first FET as an input terminal, connecting a drain electrode of said first FET to a constant voltage source through a first load, connecting a second FET in parallel with said first load, and grounding a gate electrode of said first FET;

a differential amplification circuit connecting a source electrode of a third FET to a first constant current source, connecting a source electrode of a fourth FET to a second constant current source, and interposing a fifth FET between the source electrode of said third FET and the source electrode of said fourth FET; and a double-balanced mixer circuit connecting a drain electrode of a sixth FET and a drain electrode of a seventh FET to said constant voltage source, connecting a drain electrode of an eighth FET and a drain electrode of a ninth FET to said constant voltage source through a second load, connecting the source electrode of said sixth FET to the source electrode of said eighth FET, connecting the source electrode of said seventh FET to the source electrode of said ninth FET, using the gate electrode of said sixth FET and the gate electrode of said ninth FET as a first input terminal for a local oscillation signal, and using the gate electrode of said seventh FET and the gate electrode of said eighth FET as a second input terminal of said local oscillation signal;

wherein the drain electrode of said first FET of said gate grounded electrode is connected to the gate electrode of said third FET of said differential amplification circuit, a third load is interposed between the gate electrode of said third FET and the gate electrode of said fourth FET, the source electrodes of said sixth and eighth FETs are connected to the drain electrode of said third FET, and the source electrodes of said seventh and ninth FETs are connected to the drain electrode of said fourth FET.

5. A semiconductor device for a tuner comprising:

a gate grounded circuit using a source electrode of a first FET as an input terminal, connecting a drain electrode of said first FET to a constant voltage source through a first load, connecting a second FET in parallel with said first load, and grounding a gate electrode of said first FET;

a differential amplification circuit connecting a source electrode of a third FET to a constant current source, connecting a source electrode of a fourth FET to said constant current source, and interposing a fifth FET between a drain electrode of said third FET and a drain electrode of said fourth FET; and a double-balanced mixer circuit connecting a drain electrode of a sixth FET and a drain electrode of a seventh FET to said constant voltage source, connecting a drain electrode of an eighth FET and a drain electrode of a ninth FET to said constant voltage source through a second load, connecting the source electrode of said sixth FET to the source electrode of said eighth FET, connecting the source electrode of said seventh FET to the source electrode of said ninth FET, using the gate electrode of said sixth FET and the gate electrode of said ninth FET as a first input terminal of a local oscillation signal, and using the gate electrode of said seventh FET and the gate electrode of said eighth FET as a second input terminal of said local oscillation signal;

wherein the drain electrode of said first FET of said gate grounded circuit is connected to the gate electrode of said third FET of said differential amplification circuit, a third load is interposed between the gate electrode of said third FET and the gate electrode of said fourth FET, the source electrodes of said sixth and eighth FETs are connected to the drain electrode of said third FET, and the source electrodes of said seventh and ninth FETs are connected to the drain electrode of said fourth FET.

6. A semiconductor device for a tuner comprising:

a gate grounded circuit using a source electrode of a first FET as an input terminal, connecting a drain electrode of said first FET to a constant voltage source through a first load, and grounding a gate electrode of said first FET;

a differential amplification circuit connecting a source electrode of a second FET to a first constant current source, connecting a source electrode of a third FET to a second constant current source, and interposing a fourth FET between the source electrode of said second FET and the source electrode of said third FET; and a double-balanced mixer circuit connecting a drain electrode of a fifth FET and a drain electrode of a sixth FET to said constant voltage source, connecting a drain electrode of a seventh FET and a drain electrode of an eighth FET to said constant voltage source through a second load, connecting the source electrode of said fifth FET to the source electrode of said seventh FET, connecting the source electrode of said sixth FET to the source electrode of said eighth FET, using the gate electrode of said fifth FET and the gate electrode of said eighth FET as a first input terminal of a local oscillation signal, and using the gate electrode of said sixth FET and the gate electrode of said seventh FET as a second input terminal of said local oscillation signal;

wherein the drain electrode of said first FET of said gate grounded circuit is connected to the gate electrode of said second FET of said differential amplification circuit, a ninth FET is interposed between the gate electrode of said second FET and the gate electrode of said third FET, the source electrodes of said fifth and seventh FETs are connected to the drain electrode of said second FET, and the source electrodes of said sixth and eighth FETs are connected to the drain electrode of said third FET.

7. A semiconductor device according to claim 1 wherein the device is mounted to a tuner.

8. A semiconductor device according to claim 2 wherein the device is mounted to a tuner.

9. A semiconductor device according to claim 3 wherein the device is mounted to a tuner.

10. A semiconductor device according to claim 4 wherein the device is mounted to a tuner.

11. A semiconductor device according to claim 5 wherein the device is mounted to a tuner.

12. A semiconductor device according to claim 6 wherein the device is mounted to a tuner.

* * * * *